United States Patent [19]

Omoda et al.

[11] Patent Number: 4,899,273
[45] Date of Patent: Feb. 6, 1990

[54] CIRCUIT SIMULATION METHOD WITH CLOCK EVENT SUPPRESSION FOR DEBUGGING LSI CIRCUITS

[75] Inventors: Koichiro Omoda, Sagamihara; Shunsuke Miyamoto, Tokyo; Takayuki Nakagawa; Yoshio Takamine, both of Kokubunji; Shigeo Nagashima, Hachioji; Masayuki Miyoshi, Hadano; Yoshiharu Kazama, Hadano; Yoshiaki Kinoshita, Hadano, all of Japan

[73] Assignee: Hitachi, Ltd., Tokyo, Japan

[21] Appl. No.: 940,539

[22] Filed: Dec. 10, 1986

[30] Foreign Application Priority Data

Dec. 11, 1985 [JP] Japan .................................. 60-276761

[51] Int. Cl.⁴ .......................... G06F 9/44; G06F 11/22; G06F 11/26
[52] U.S. Cl. .................................... 364/200; 364/221; 364/221.7; 364/264; 364/264.3; 364/265; 364/267; 364/267.2; 364/267.4; 364/267.91; 364/270; 364/270.3; 364/285; 371/23
[58] Field of Search ................. 364/578, 200 MS File, 364/900 MS File; 371/23

[56] References Cited

U.S. PATENT DOCUMENTS

| | | | |
|---|---|---|---|
| 3,932,843 | 1/1976 | Trelut et al. | 364/200 |
| 3,961,250 | 6/1976 | Snethen | 371/23 X |
| 4,306,286 | 12/1981 | Cocke et al. | 364/200 |
| 4,342,093 | 7/1982 | Miyoshi | 371/23 X |
| 4,635,218 | 1/1987 | Widdoes, Jr. | 371/20 X |
| 4,654,851 | 3/1987 | Busby | 371/23 X |
| 4,713,606 | 12/1987 | Laviron | 364/578 X |
| 4,747,102 | 5/1988 | Funatsu | 371/23 |

*Primary Examiner*—Archie E. Williams, Jr.
*Assistant Examiner*—Robert B. Harrell
*Attorney, Agent, or Firm*—Antonelli, Terry & Wands

[57] ABSTRACT

A computer implemented logic simulation method, for inspecting logical operations of large scale logic circuits, computes a variation of an output of at least one latch in a clock synchronized logic circuit. The clock-synchronized logic circuit contains a combination logic circuit and a plurality of logic gates. Each of the logic gates have at least one input signal and several other inputs connected to clocking signal sources of different phases. The latch is activated by the rise or fall of the clock signals for holding the output from the combination logic circuit. The method thus implements sampling instants of the output for ascertaining the logical operations of the large scale circuits.

2 Claims, 16 Drawing Sheets

▼ : EVALUATION TIMING

FIG. 7a
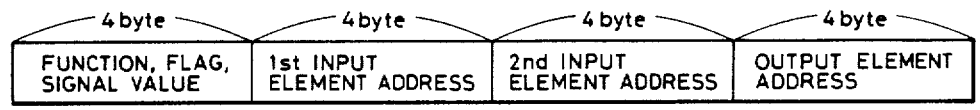
FIG. 7b
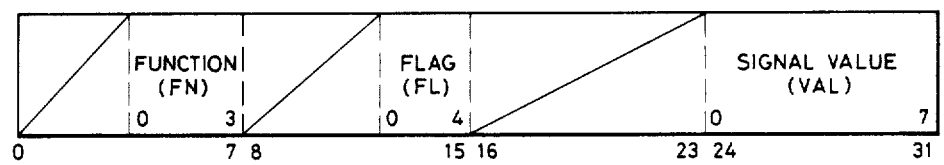
FIG. 7c
| SIGNAL | SIGNAL VALUE (VAL) |
|---|---|
| NON-INVERTED CLOCK "Ci" | 1 0 X X X X X X <br> CLOCK PHASE NUMBER i |
| INVERTED CLOCK "-Ci" | 1 1 X X X X X X <br> CLOCK PHASE NUMBER i |
| EXTERNAL INPUT SIGNAL "0" | 0 0 0 0 0 0 0 0 |
| EXTERNAL INPUT SIGNAL "1" | 0 0 0 0 0 0 0 1 |

FIG. 7d $FL_0$: $\begin{cases} 1 \rightarrow \text{THERE ARE INPUTS OF TWO CLOCK SIGNAL VALUES.} \\ 0 \rightarrow \text{OTHERWISE} \end{cases}$ $FL_1$: $\begin{cases} 1 \rightarrow \text{THERE IS AN INPUT OF A CLOCK SIGNAL VALUE WITH THE SAME PHASE NUMBER AS THE CURRENT CLOCK.} \\ 0 \rightarrow \text{OTHERWISE} \end{cases}$ $FL_2$: $\begin{cases} 1 \rightarrow \text{THERE IS AN INPUT OF A CLOCK SIGNAL VALUE WITH A PHASE NUMBER DIFFERENT FROM THE CURRENT CLOCK.} \\ 0 \rightarrow \text{OTHERWISE} \end{cases}$ $FL_3$: $\begin{cases} 1 \rightarrow \text{RENEWAL OF THE SIGNAL VALUE VAL IS ALLOWED.} \\ 0 \rightarrow \text{RENEWAL OF THE SIGNAL VALUE VAL IS PROHIBITED.} \end{cases}$ $FL_4$: $\begin{cases} 1 \rightarrow FL_3 \text{ IS 1 AND THE SIGNAL VALUE VAL HAS CHANGED FROM BEFORE AN OPERATION TO AFTER THE OPERATION.} \\ 0 \rightarrow \text{OTHERWISE} \end{cases}$

FIG. 7e $FN_0$: $\begin{cases} 1 \rightarrow \text{AN OPERATION FOR AN LATCH IS REQUIRED.} \\ 0 \rightarrow \text{AN OPERATION FOR A GATE IS REQUIRED.} \end{cases}$ $FN_{1-3}$: A SPECIFIC ONE OF OPERATIONS FOR AN LATCH OR OPERATIONS FOR A GATE IS DESIGNATED.

FIG. 14

| INPUT VALUE \ CURRENT CLOCK | $C_m$ | $-C_m$ |
|---|---|---|
| 0 | 0 | 0 |
| 1 | 1 | 1 |
| $C_m$ | 1 | 0 |
| $-C_m$ | 0 | 1 |
| $C_p$ | 0 | 0 |
| $-C_p$ | 1 | 1 |

($m \neq p$)

FIG. 13

| VALUE OF A 1st INPUT \ VALUE OF A 2nd INPUT | AND OPERATION | | | | | | | | OR OPERATION | | | | | | | | EOR OPERATION | | | | | | | | NOT OPERATION |
|---|---|---|---|---|---|---|---|---|---|---|---|---|---|---|---|---|---|---|---|---|---|---|---|---|---|
| | 0 | 1 | Cm | -Cm | Cp | -Cp | | | 0 | 1 | Cm | -Cm | Cp | -Cp | | | 0 | 1 | Cm | -Cm | Cp | -Cp | | | |
| 0 | 0 | 0 | 0 | 0 | 0 | 0 | | | 0 | 1 | Cm | -Cm | Cp | -Cp | | | 0 | 1 | Cm | -Cm | Cp | -Cp | | | 1 |
| 1 | 0 | 1 | Cm | -Cm | Cp | -Cp | | | 1 | 1 | 1 | 1 | 1 | 1 | | | 1 | 0 | -Cm | Cm | -Cp | Cp | | | 0 |
| Cm | 0 | Cm | Cm | 0 | Cm | -Cm | | | Cm | 1 | Cm | 1 | Cm-Cm | 1 | | | Cm | -Cm | 0 | 1 | Cm-Cp | Cm | | | -Cm |
| -Cm | 0 | -Cm | 0 | -Cm | 0 | Cm | | | -Cm | 1 | 1 | -Cm | 1 | -Cm-Cm | | | -Cm | Cm | 1 | 0 | -Cm | -Cm-Cp | | | Cm |
| Cp | 0 | Cp | Cm | 0 | Cp | 0 | | | Cp | 1 | Cm-Cm | 1 | Cp | 1 | | | Cp | -Cp | Cm | -Cm | 0 | 1 | | | -Cp |
| -Cp | 0 | -Cp | 0 | Cm | 0 | -Cp | | | -Cp | 1 | 1 | Cm-Cm | 1 | -Cp | | | -Cp | Cp | -Cm | Cm | 1 | 0 | | | Cp |

(m : A PHASE NUMBER OF A CURRENT CLOCK p≠m)

CIRCUIT SIMULATION METHOD WITH CLOCK EVENT SUPPRESSION FOR DEBUGGING LSI CIRCUITS

BACKGROUND OF THE INVENTION

The present invention relates to a logic simulation system for a digital logic circuit and, more particularly, to a logic simulation system suitable for inspecting the logic operation of a large-scale logic circuit at high speed.

One of the serious problems affecting the development of a computer relates to the debugging of the logic (e.g., the logic inconsistency arising inside of the computer, when an instruction is to be executed, so that an ordinary execution result cannot be obtained).

Especially a large-sized computer in recent years has large-scaled and complicated circuitry so that it uses a number of LSIs. If a large number of logic inferiorities occur in the LSIs, troublesome work, is required for remaking those LSIs, which undesirably impacts upon the development term. This makes it far more necessary to extract the logic inferiorities at an early stage thereby to make logic simulation indispensable. In the current practice, more specifically, the results when a designed circuit is operated are computed from the design data of the circuit by the computer or the like, thereby to judge whether or not a logic inferiority has existed in the original circuit design.

The logic simulation per se is disclosed in the following book:
Title:
 Diagnosis & Reliable Design of Digital Systems (Chapter 4: Logic Level Simulation, pp. 174 to 248):
Authors:
 Melvin A. Breuer
 Arthur D. Friedman:
Publisher:
 Computer Science Press, Inc.
 Digital System Design Series.

Many large-scale computers or VLSIs adopt a synchronous type logic circuit. In this synchronous logic circuit, flip-flops and combination circuits are so connected that the flip-flops are operated in synchronism with clocks by using the clocks without fail in the set and reset conditions of the flip-flops to apply the output of each flip-flop to another flip-flop through the combination circuits.

By making use of that feature of the synchronous type logic circuit, the following logic simulation method has been developed (as disclosed in Japanese Patent Application No. 28536/1984, filed on Feb. 20, 1984).

More specifically, a predetermined input signal value is given to a combination circuit surrounded between flip-flops (which are also called "latches"). Assuming that the delay time of the circuit elements (which are also called "gates") in the combination circuit having logic operation functions such as AND, OR or NOT is zero, output signal values are sequentially evaluated (i.e., the logic operation for computing the output signal values from the input signal values) from the input signal values of individual circuit elements at clock time (which is called a "time step"), based on an event drive system, to compute the output signal values from the aforementioned combination circuits. Here, the event drive system is a system for sequentially evaluating, while selecting at each time step, only such circuit elements included in the aforementioned combination circuits as may possibly have their input signal values changes between the preceding time step and the present time step, and accordingly have their output signal values varying. Incidentally, the "event" defined herein has a wide meaning of circuit elements themselves, in which the signal values have varied, and a narrow meaning of circuit elements themselves in which the input signal values have varied.

Of the output signal values outputted from the combination circuits, moreover, the output signal values of the flip-flops made receptive of the varying output signal values of the circuit elements are evaluated (or computed) from input values and clock phases to be fed to those flip-flops.

If the simulation based on the method described above is practised, many variations of the clock signal values occur. This is caused by the fact that the operations of the synchronous type logic circuits are conducted by the data transfer between the latches made receptive of the clock signals.

For example, a logic circuit as shown in FIG. 1 will be examined in the following. In FIG. 1: reference numerals 11, 12 and 13 denote input lines providing an external input signal IN, a clock signal CLK and a constant level signal CONST, respectively; character $g_1$ denotes an OR gate; character $g_2$ denotes an AND gate; and character $l_1$ denotes a latch (which is also called a "flip-flop"). The lines 11 to 13 will be referred to hereinafter as the "IN terminal", the "CLK terminal" and the "CONST terminal", respectively. In case the time period (which is called a "machine cycle") for executing fundamental operations in a logic unit is divided into one or more processing time units (i.e., 0, 1, 2, - - -, and n-1), as shown in FIG. 2, clock signal specifies those processing time units.

Moreover, the, clock signals corresponding to the individual time units will be sequentially called the "clock signals having clock phase numbers 0 to n-1" and denoted by $C_0$ to $C_{n-1}$ for simplification. FIG. 2 shows the four clocks $C_0$ to $C_3$, for example.

In case the signal IN varies after the clock signal has varied in the sequence of "0"-"1"-"0", as shown in FIG. 2, the outputs of the gates $g_1$ and $g_2$ and the latch $l_1$ will vary, as shown in FIG. 3. In a machine cycle MCO, more specifically, the output of the gate $g_1$ varies in response to the rise and fall of the clock signal $C_0$. In a machine cycle $MC_1$, the outputs of the gates $g_1$ and $g_2$ and the latch $l_1$ will vary in response to the rise of the clock signal $C_0$, and the outputs of the gates $g_1$ and $g_2$ will fall in response to the fall of the clock signal $C_0$.

In the case of the logic simulation of this circuit, the aforementioned Patent Application is required in accordance with the variations of the clock signal to have the evaluations (i.e., the logic operations for computing the output signal values from the input signal values) of the element $g_1$ made receptive of the clock signal, the element $g_2$ made receptive of the output of the element $g_1$, and the output of the element $l_1$ made receptive of the element $g_2$. Incidentally, without variation of the clock signal value, no evaluation of each element becomes necessary, and the previous output signal value may be referred to as it is. As the scale of the circuit is enlarged, the computation time period for this evaluation is markedly extended.

These variations of the clock signal never fail to be experienced as two per machine cycle, i.e., the rise of '0'→'1' and fall-down of '1'→'0' of the clock signal so that a number of ineffective element evaluations will occur. Here, the "ineffective element evaluation" means a useless element evaluation exerting no influence upon the actual logic operations.

As shown in FIG. 3, for example, the rise and fall of the clock, as indicated at circled b and c, will not influence the latch $l_1$. Incidentally, the evaluations encircled d to g of the element have been practised in the prior art.

Therefore, it could be expected to drastically improve the logic simulation processing speed if the useless element evaluations of the variations of the clock signals caused by the rise/fall of the clock signals could be suppressed as much as possible.

SUMMARY OF THE INVENTION

A first object of the present invention is to provide both a clock-synchronized simulation method of simulating the logic operations of combination circuits between flip-flops, while operating the flip-flops at a constant time, by using clock signals as conditions for setting and resetting the flip-flops and a logic simulation system for logically simulating the operations of a digital logic circuit, based on a zero delay time event drive method premising the zero circuit delay time of combination circuits enclosed by the flip-flops, which system is enabled to drastically improve the logic simulation processing speed of the digital logic circuit by suppressing as much as possible the ineffective element evaluation exerting no influence upon the actual logic operations.

A second object of the present invention is like the first object to provide both a clock-synchronized simulation method and a logic simulation processor based on the zero delay time event drive method, which processor is enabled to drastically improve the logic simulation processing speed of the digital logic circuit by totally conducting the high-speed processings in a vectorized manner by the use of a vector processor such as HITAC S-810.

In order to achieve the above-specified object of the present invention, the clock signal value is not expressed by '0' or '1' as in the prior art, but a value '$C_i$' is newly introduced as the clock signal value. Here, the value '$C_i$' is assumed to express the phase number of the clock. As a result, the clock signal value of the prior art is varied from '0' to 1' or '1' to '0' in accordance with the rise or fall of the clock so that its variations accordingly propagate without intermission. In the present invention, however, the clock signal value remains at '$C_i$'.

In the clock-synchronized type logic circuit, moreover, the logic operations of the circuit elements such as AND/OR/NOT are conducted including the clock signal value '$C_i$' itself when the combination circuit is to be simulated by the event drive method. In case the clock signal value propagates through the combination circuit until it is inputted to the latch, the clock signal value '$C_i$' is converted into 0 (for $j \neq i$) or 1 (for $j = i$), based on a clock phase number j being simulated at present, to determine the state of the latch.

On the other hand, the second object of the present invention is achieved in the following manner. For each circuit element, there are provided in a main storage a connection table for designating the function (e.g., the logic operation of AND/OR/NOT or the operation of the latch), the output signal value (which will be merely referred to as the "signal value") and information relating to the connection with another element and event tables 1 and 2 for storing the element which has its input signal value varied. And, the elements having their input signal values varied are continuously read out from the event table 1 into vector registers (VR). On the basis of this, the function of the corresponding element, the output signal value and the information (for designating the input element and the output element) of the connection with another element are read out from the vector registers. On the basis of such one piece of the connection information read out into the vector registers as designates the input element, the input signal value to the corresponding element is read out from the connection table into the vector registers. Moreover, the function read out into the vector registers, the input signal value, the current clock information (e.g., the phase number of the clock being simulated at present) set into scalar registers (SR) are inputted into simulation-oriented arithmetic and logic units having high-speed processing functions, to compute a new output signal. Subsequently, the new output signal value is compared with the preceding one. If this comparison reveals a variation, that new output signal value is written in the corresponding connection table. Simultaneously with this, the information of another element receptive of that new output value, i.e., such piece of the connection information having been previously loaded in the vector registers for designating the output element, is stored in the event table 2. The processings described above are continuously executed until the event table 1 becomes empty. When this occurs, the element, in which the input signal value stored in the event table 2 is newly varied, is transferred to the event table 1, and the aforementioned processing procedures are repeated. Incidentally, the event tables 1 and 2 may be alternately used.

Moreover, the arithmetic and logic units having the aforementioned simulation-oriented high-speed processing functions are, so constructed that they can execute continuous using a pipe-line method both the logic operations of the combination circuit elements containing as the input signal values the clock signal value '$C_1$' introduced newly by the present invention and the latch state transition operations containing the clock signal value '$C_1$' as the input signal values.

BRIEF DESCRIPTION OF THE DRAWINGS

FIG. 7A shows structure of each entry of the gate/latch connection table;

FIG. 7B shows a structure of the first field of each entry of the gate/latch connection table;

FIG. 7 shows a relation between a signal value held in the first field of each entry of the gate/latch signals and external input signals;

FIG. 7D shows various states which flags held in the first field of each entry of the gate/latch connection table represent;

FIG. 7E shows what functions the function codes held in the first field of each entry of the gate/latch connection table represent;

FIG. 13 is a diagram showing an example of the gate operations using the clock signal values featuring the present invention;

FIG. 14 is a diagram showing the input value conversions conducted in the processing prior to the latch operations using the clock signal values featuring the present invention;

DETAILED DESCRIPTION OF THE EMBODIMENT

Before entering into the detailed description of the embodiment of the present invention, cursory review will be made of the clock signal values to be introduced by the present invention and a method of utilizing them.

Figure 2:
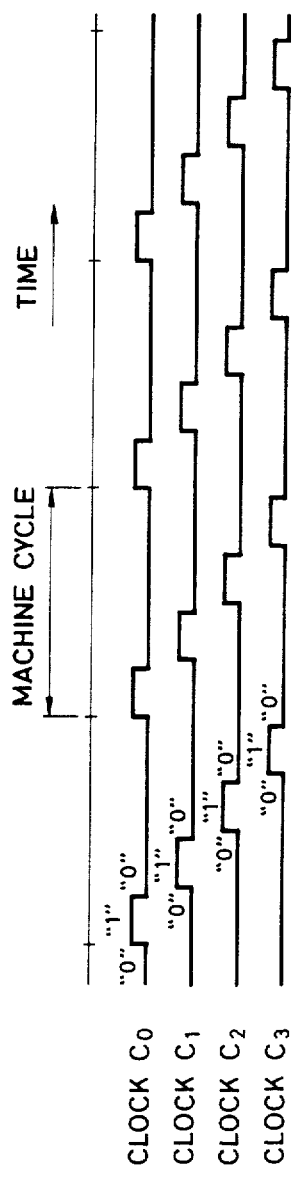
FIG. 2 is a time chart showing the clock signals.

In the prior art, as shown in FIG. 2, the clock signals are defined to have the value '0' or '1' for a constant time period from a predetermined instant. In the present invention, on the contrary, the clock signal values are collectively defined as the clock signal value '$C_i$'. Here, the letter i denotes the phase numbers of the clocks.

Figure 1:
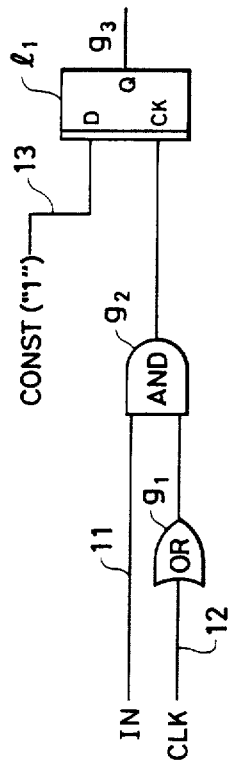
FIG. 1 is a block diagram showing an example of a logic circuit.

At first or at the initial setting, by impressing each clock signal value to a CLK input terminal or a predetermined initial value to another input terminal, the clock signal value is caused to propagate to a propagatable portion until the latch is reached. For example, in FIG. 1, the signal value '$C_0$' propagates to the output of a gate $g_i$, but it depends upon the condition of the IN terminal whether or not the signal value '$C_0$' will propagate to the output of the gate $g_2$. More specifically, if the gate $g_2$ is an AND gate, for example, the signal value '$C_0$' can propagate to the output of the gate $g_2$, if the IN terminal is at '1', but not if the IN terminal is at '0'. Now, if the IN terminal were at '0', the output value of the gate $g_2$ would be at '0' so that the clock signal value '$C_0$' would not propagate any more. Incidentally, if the IN terminal were at '1', the output value of the gate $g_2$ would take the value '$C_i$', and the clock signal value could possibly further propagate. Since the IN terminal is followed by the latch in this example, the propagation of the clock signal value terminates at the gate $g_2$. And, the values of the gate $g_1$, the gate $g_2$ and the latch $l_1$ after the end of the initial setting are those which occur at the time of circled a of FIG. 4. Incidentally, the output value of the latch $l_1$ is given '0' as the initial value.

Next, the simulation is started while proceeding the machine cycle. At this time, at least the input value of the gate $g_1$ remains at '$C_0$' so that no event occurs. In other words, it is unnecessary to evaluate the gate $g_1$ because the input value does not vary.

For the gate $g_2$, an event occurs (whereas the other input value always remains at '$C_0$') only when the value of the IN terminal varies. On the other hand, the latch $l_1$ has to be evaluated because an event occurs when the output value of the gate $g_2$ varies.

Figure 3:
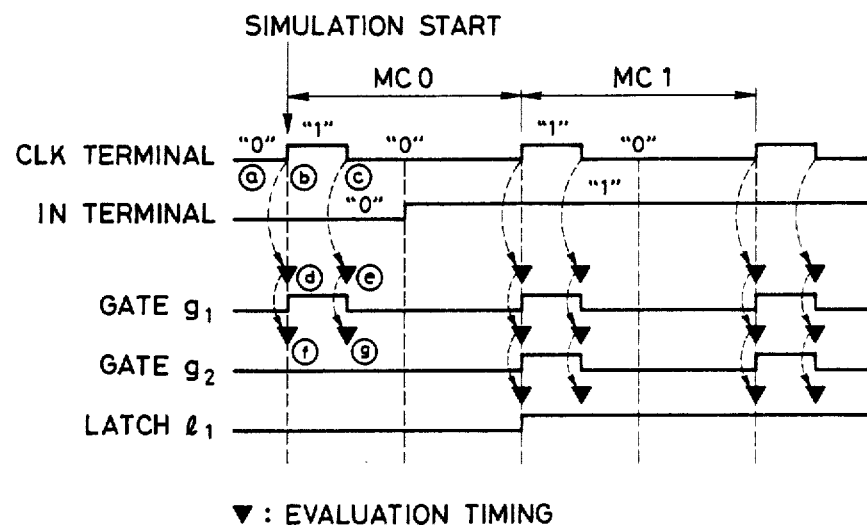
FIG. 3 is a diagram showing the event generation phenomena in case the logic circuit of FIG. 1 is constructed by the simulation method of the prior art.
Figure 4:
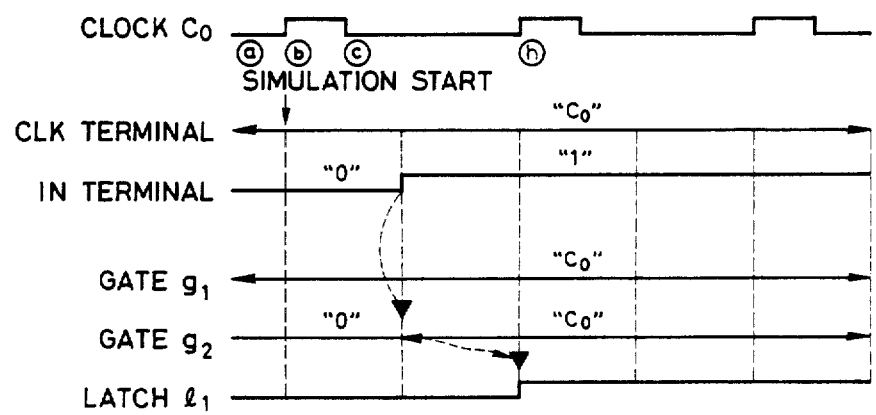
FIG. 4 is a diagram showing the event generation phenomena in case the clock event suppression featuring the present invention is conducted.

In this example, the output value of the gate $g_2$, i.e., the input value of the latch $l_1$ can take the value '$C_0$' or '0'. Generally speaking, however, the clock signals are in multiple phases, as shown in FIG. 2, and the clock signals '$C_0$', '$C_1$', - - -, and '$C_{n-1}$' are contained as the input value of the latch. These signal values are converted into '0' or '1' on the basis of the clock states (which are generally the clock phase numbers and the rise/fall information), and the latch is then evaluated. Thus, these clock signal values to be inputted to the clock input terminal are not so inputted as to periodically vary by using '0' and '1', as shown in FIG. 3, but the clock signals themselves varying periodically by using '0' and '1' are collectively defined as the clock signal value '$C_i$', as shown in FIG. 4. If this signal value '$C_i$' is inputted at the initial setting to the clock input terminal and is once caused to propagate, it is possible to drastically suppress generations of the ineffective gate or latch event relating to the transmission and passage of the clock signals.

Figure 15:
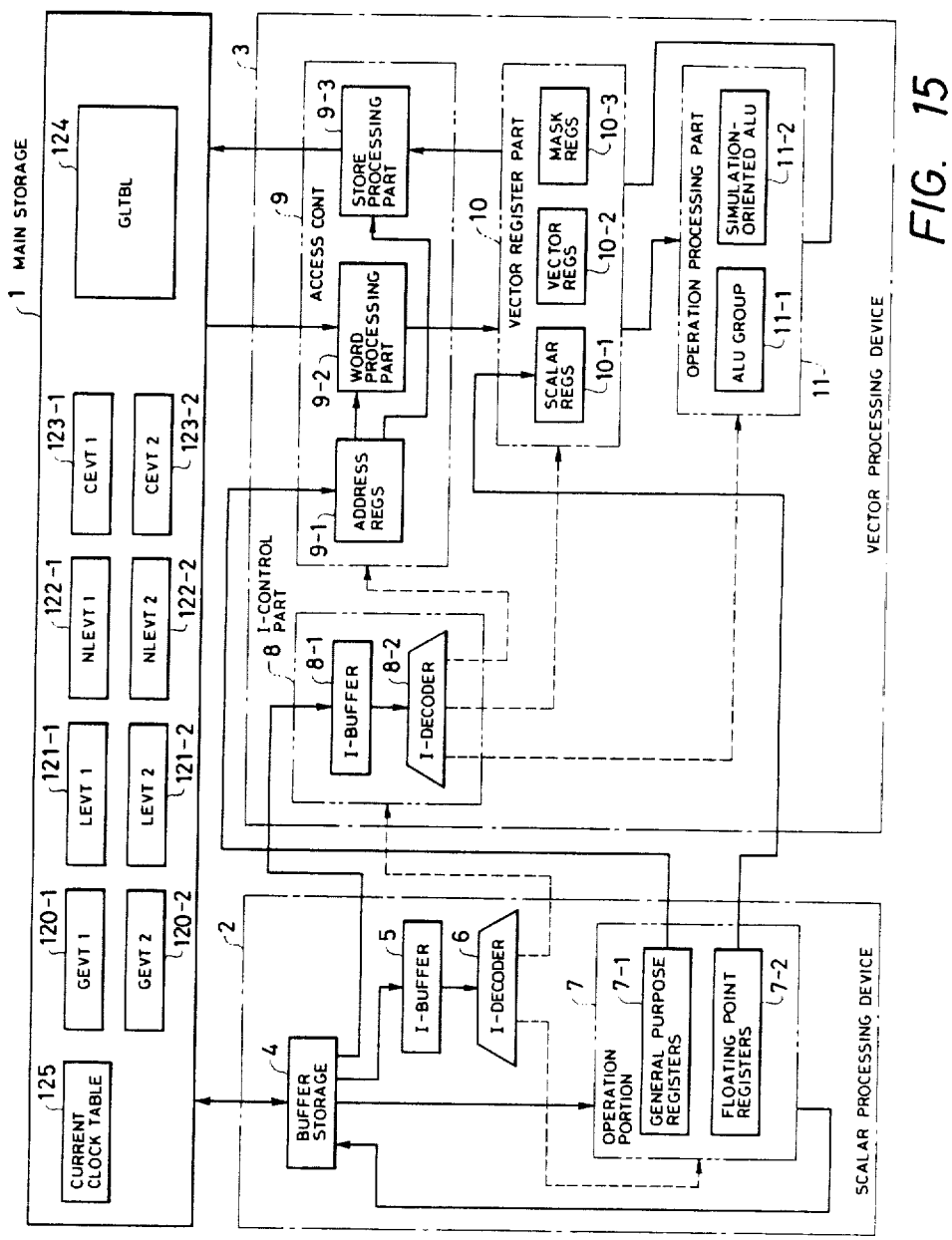
FIG. 15 is a block diagram showing one embodiment of the logic simulation system of the present invention.

FIG. 15 schematically shows the hardware construction of one embodiment of the present invention. In FIG. 15: reference numeral 1 denotes a main storage; numeral 2 a scalar processing device; numeral 3 a vector processing device; numeral 4 a buffer storage; numeral 5 an instruction buffer; numeral 6 an instruction decoder; numeral 7 an operation portion; numeral 7-1 general purpose registers; numeral 7-2 floating point registers; numeral 8 an instruction control part; numeral 8-1 an instruction buffer; numeral 8-2 an instruction decoder; numeral 9 an access control part; numeral 9-1 a group of address registers for storing address information when the main storage 1 is to be accessed; numeral 9-2 a word processing part; numeral 9-3 a store processing part; numeral 10 a vector register part; numeral 10-1 a group of scalar registers; numeral 10-2 a group of vector registers; numeral 10-3 a group of mask registers; numeral 11 an operation processing part; numeral 11-1 a group of arithmetic and logic units; numeral 11-2 a simulation-oriented arithmetic and logic unit; numerals 120-1 and 120-2 first and second gate event tables GEVT1 and GEVT2; numerals 121-1 and 121-2 first and second latch event tables LEVT1 and LEVT2; numerals 122-1 and 122-2 first and second next latch event tables NLEVT1 and NLEVT2; numerals 123-1 and 123-2 first and second multiple clock gate event tables CEVT1 and CEVT2; numeral 124 a gate/latch connection table GLTBL; and numeral 125 a current clock table CC. In FIG. 15, the scalar processing device 2 and the vector processing device 3 are well known in the art except the simulation-oriented ALU 11-2.

Figure 16:
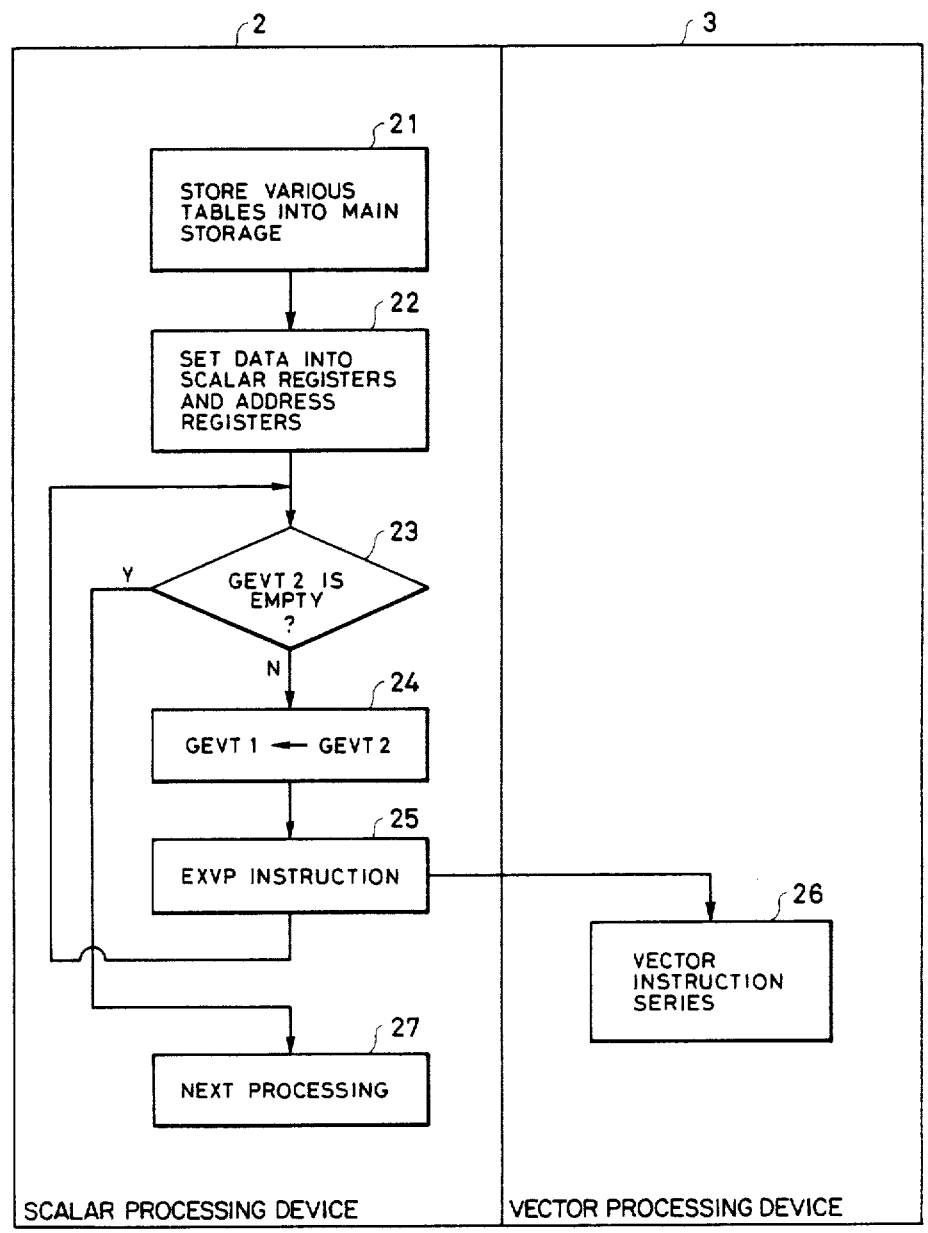
FIG. 16 is a flowchart showing the general vector processings based on the construction of FIG. 15.

FIG. 16 is a flow chart showing the processings of vector instructions, which will be described with reference to FIG. 15. A preliminary processing for executing a vector instruction is conducted by using a scalar instruction. This preliminary processing (at steps 21 to 24) includes: setting of address information into the address registers 9-1 through the general purpose registers 7-1; and setting of scalar data into the scalar registers 10-1 through the floating point registers 7-2.

Next, if the instruction decoder 6 decodes an EXVP instruction, the instruction control part 8 is started to start the processings of a series of vector instructions. The instruction control part 8 reads out the vector instruction series designated by the EXVP instruction into the instruction buffer 8-1 through the buffer storage 4. And, the vector instructions are sequentially read out from the instruction buffer 8-1 and decoded by the instruction decoder 8-2. Then, necessary decoded information is transferred to the access control part 9 for conducting the reading-out/writing-in processings of the vector data from the main storage 1, the scalar registers 10-1, the vector registers 10-2, the vector register part 10 for writing-in/reading-out of the data into and from the mask registers 10-3, and the operation processing part 11 for arithmetically operating on the data fed from the vector register part 10 so that they are processed.

Incidentally, while the vector instructions are being executed by the vector processing device, while the scalar instructions are being executed by the scalar processing device 2, and while the vector instructions are being executed by the vector processing device 3, the scalar processing device 2 can independently execute the scalar instructions.

Figure 18:
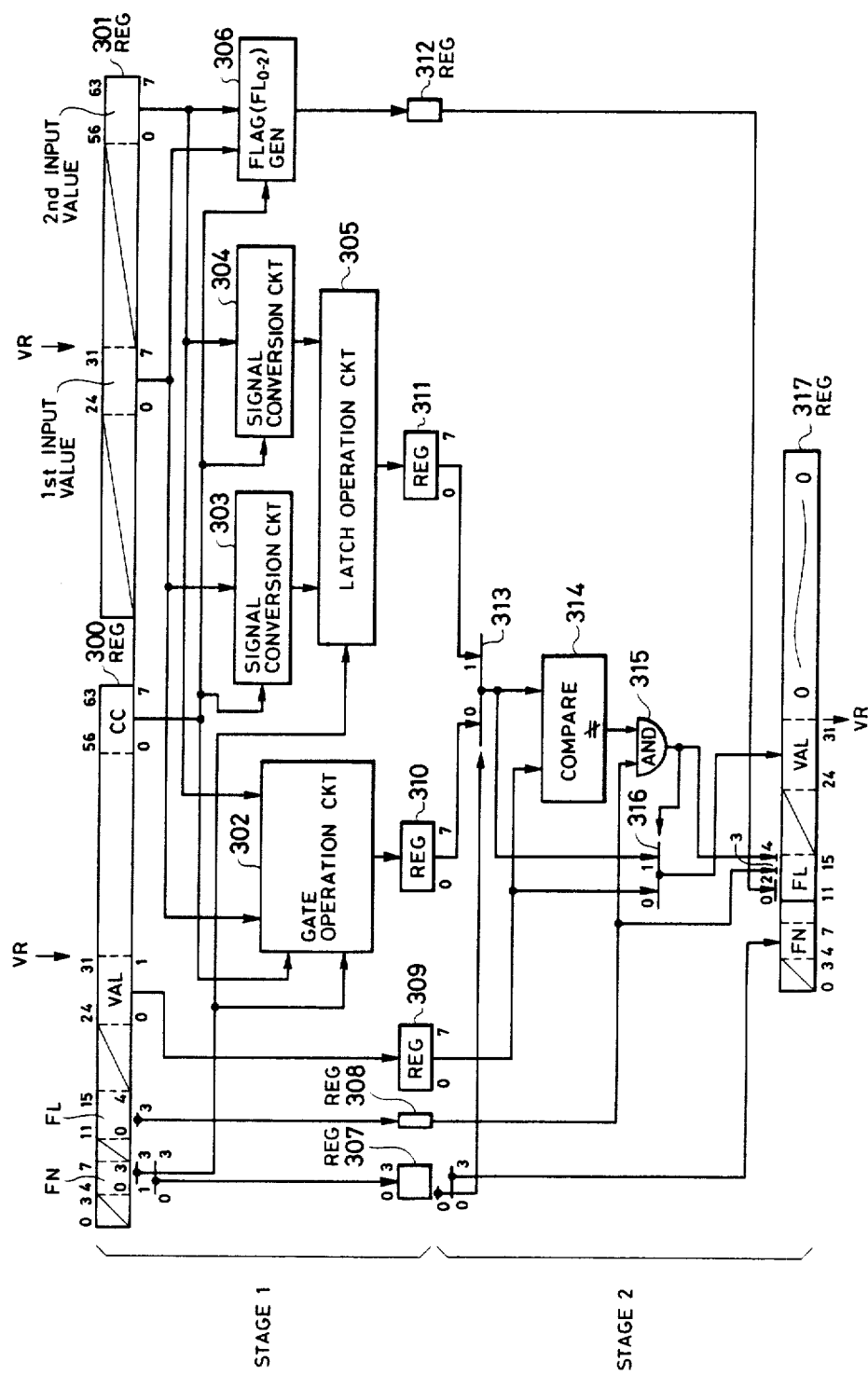
FIG. 18 is a block diagram showing a simulation-oriented arithmetic and logic unit featuring the present invention.

FIG. 18 is a block diagram showing the construction of the simulation-oriented ALU 11-2 featuring the present invention. In FIG. 18: reference numerals 300, 301, 307 to 312, and 317 denote registers; numeral 302 a gate operation circuit; numerals 303 and 304 signal conversion circuits; numeral 305 a latch operation circuit; numeral 306 a flag ($FL_{0\ to\ 2}$) generator; numerals 313 and 316 selectors; numeral 314 a comparator; and numeral 315 an AND gate.

Figure 5:
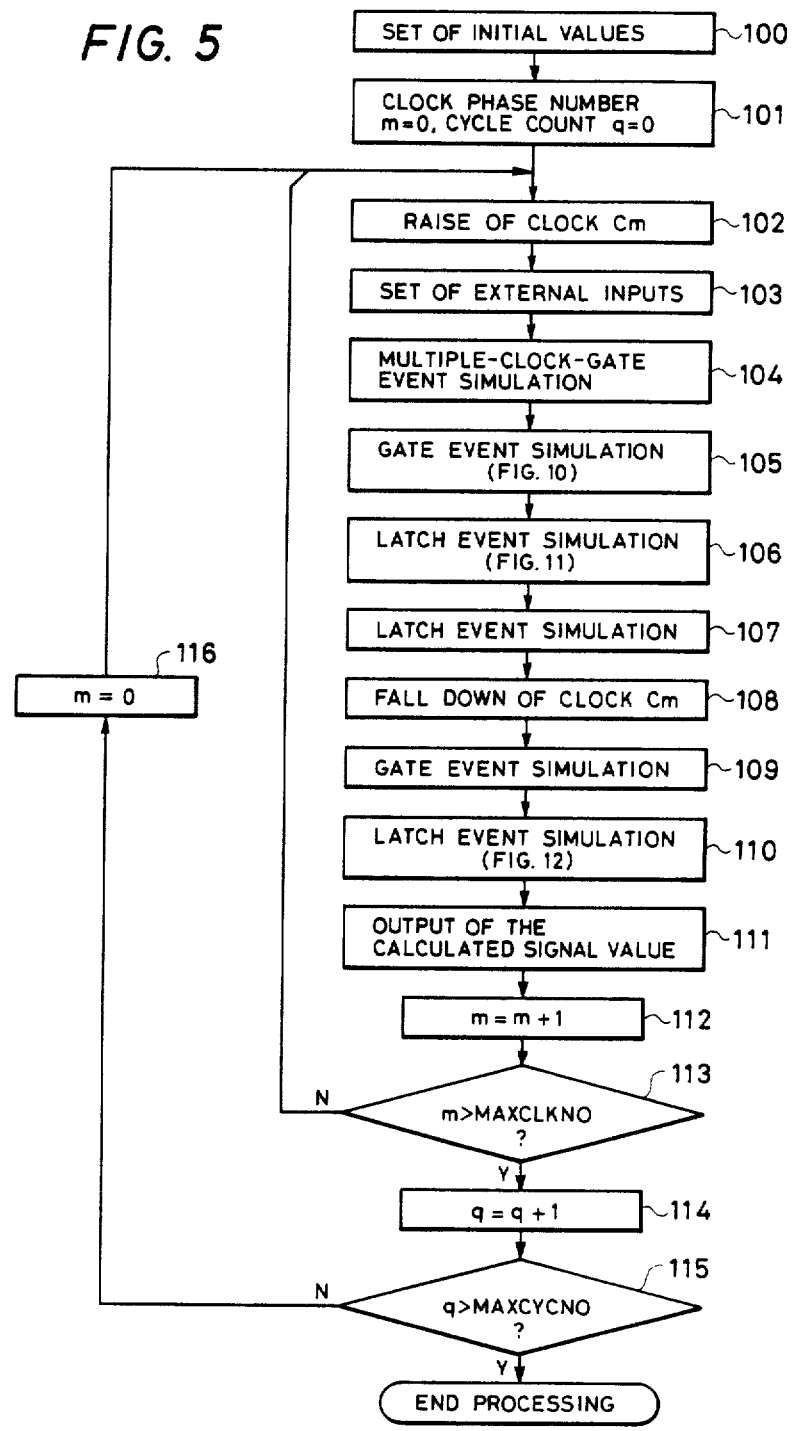
FIG. 5 is a flow chart representative of simulation according to the present invention.

FIG. 5 is a flow chart schematically showing the processing procedures of the present invention to be executed by the system of FIG. 15. These processings will be briefly described in the following. In an initial setting (at a step 100 shown in FIG. 5), the initial values of the gate or latch are set into the corresponding table 124, and the output values of the corresponding gate are set into the table 124 while conducting the propagations of the aforementioned clock signal values. Next, a clock phase number m and a cycle count q in the count clock table 125 are reset (at a step 101). After this, a series of processings (at steps 102 to 111) for the clock phase number m=0 are conducted sequentially and repeatedly a cycle number designated by MAXCYCNO. Subsequently, the same processings are executed by varying the clock phase number to the maximum phase number MAXCLKNO.

The content of the schematic processing for a certain clock phase number m is as follows:

Step 102: Raise of the clock of the phase number m as a current clock;
Step 103: Set of external inputs;
Step 104: Simulation of the multiple-clock-gate event;
Here, the multiple-clock-gate event is the gate event having two clock signal values of different clock phase numbers as the input values.
Step 105: Simulation of the gate event;
Step 106: Simulation of a latch event;
Step 107: Simulation of the latch event;
Step 108: Fall down of the clock having the phase number m;
Step 109: Simulation of the gate event;
Step 110: Simulation of the latch event;
Step 111: Read-out and output of a signal value calculated as an observation signal to an external memory (e.g., a disc);
Step 112: Count-up of the clock phase number m;
Step 113: Check of whether or not the clock phase number m is larger than the maximum phase number MAXCLKNO:
Step 114: Count-up of the cycle count q;
Step 115: Check of whether or not the cycle count q is larger than the calculated maximum cycle number MAXCYCNO; and
Step 116: Reset of the clock phase number m at 0.

When the simulation of the calculated maximum cycle number is completed, the signal value outputted at the step 111 is outputted in the form of a time chart to a viewer or printer.

Before entering into the detailed description of the processing procedures of the aforementioned steps 102 to 110, the gate/latch connection table (GLTBL) 124 will be described in the following. The structure of the individual entries of that table is shown in FIG. 7A. Each entry has a data width of 16 bytes and is constructed of four fields of 4 bytes. The first field represents a latch or gate function code (FN), a flag (FL) and a signal value (indicating an output value) (VAL), as shown in FIG. 7B.

The signal value (VAL) is composed of 8 bits and defined, as shown in FIG. 7C. The aforementioned clock signal value has its 0th bit $VAL_0$ indicating 1, its first bit $VAL_1$ indicating the existence of inversion of the polarity of the clock signal, and its second to seventh bits $VAL_{2\ to\ 7}$ indicating the clock phase numbers. For example, the clock signal value '$C_1$' is assumed to have the bit $VAL_0$ at 1, the bit $VAL_1$ at 0, and the bits $VAL_{2\ to\ 7}$ in a phase number i (i.e., 64 cases at the maximum in binary notation). Moreover, the clock signal value '$-C_i$' is assumed to have the bit $VAL_0$ at 1, the bit $VAL_1$ at 1, and the bits $VAL_{2\ to\ 7}$ in the phase number i. On the other hand, the signal value '0' having been used in the prior art has all the bits $VAL_{0\ to\ 7}$ at 0, and the signal value '1' has only the bit VAL at 1. Incidentally, it is conceivable to introduce an infinite value 'X' or a high-impedance value 'Z', which will be omitted in the present embodiment for simplification.

The flag (FL) is composed, as shown in FIG. 7D, of 5 bits $FL_0$ to $FL_4$ which have the meanings, as shown. However, the respective using purposes and methods of these bits will be described in detail hereinafter.

The function code (FN) is composed of 4 bits for designating the operation of the latch or gate, as shown in FIG. 7E. For example, in the representative operations AND, OR, EOR (i.e., Exclusive OR) and NOT of the gate, how the outputs are related to the input values is shown in FIG. 13. The current clock CC, as shown, represents what phase number of clock is being simulated at present in the course of execution of the simulation.

Next, the operation for the latch will be described in the following. In the present embodiment, in case the input value of the latch contains the clock signal value, the output value is computed by converting the clock signal value into the value '0' or '1' on the basis of the current clock CC, as shown in FIG. 14.

Incidentally, the data widths of the function code FN, the flag FL and the signal value VAL depend on the circuitry of the processing system for executing the simulation and should not be limited to those of the present embodiment.

The second and third fields of FIG. 7A are assumed to indicate the addresses (i.e., the first and second input element addresses) concerning what entries of the gate/latch connection table 124 the gate or latch for providing the two inputs of its own gate or latch is located in. Incidentally, the gate/latch connection table 124 is assumed to be prepared before the simulation execution by a logic complier and stored upon the execution into the main storage 1. On the other hand, the fourth field is assumed to indicate the address (i.e., the output element address) concerning what entries of the gate/latch connection table 124 the gate or latch receptive of the output of its own gate or latch is located in. Incidentally, in the present embodiment, the gate and latch having two inputs and one output are used as basic elements for simplification but can be expanded to have more inputs and outputs.

Figure 8:
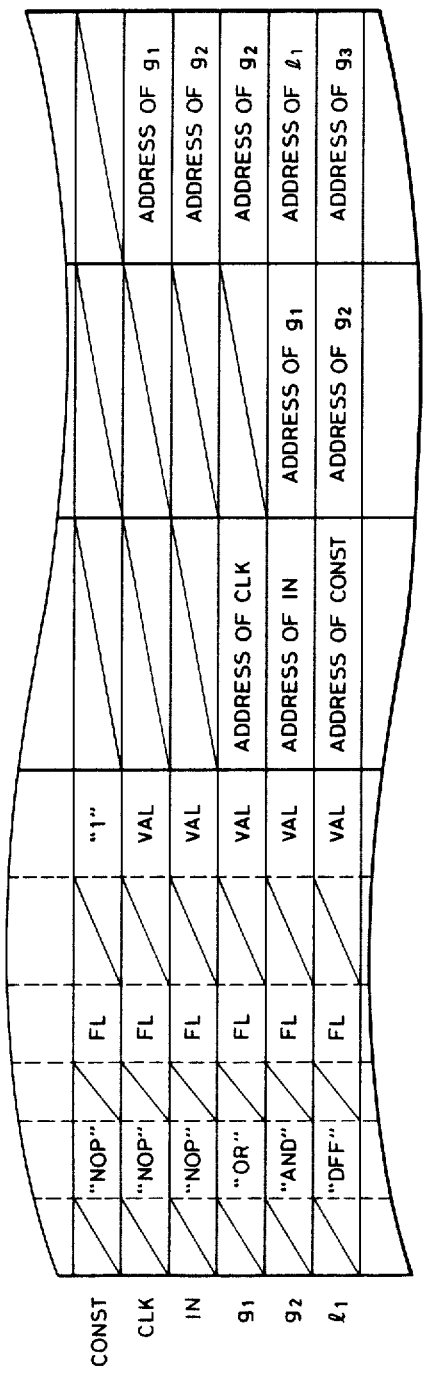
FIG. 8 shows initial data of a gate/latch connection table for the circuit shown in FIG. 1.

FIG. 8 shows one example of the gate/latch connection table 124. This table is prepared by the logic complier on the basis of the logic circuit shown in FIG. 1. Reference letters CONST, CLK and IN denote the input terminals whereas the function code (FN) is denoted at 'NOP' indicating an ineffective operation. Since the input terminal CONST is at the constant value '1', moreover, the signal value (VAL) for it is set at '1'.

Figure 9B:
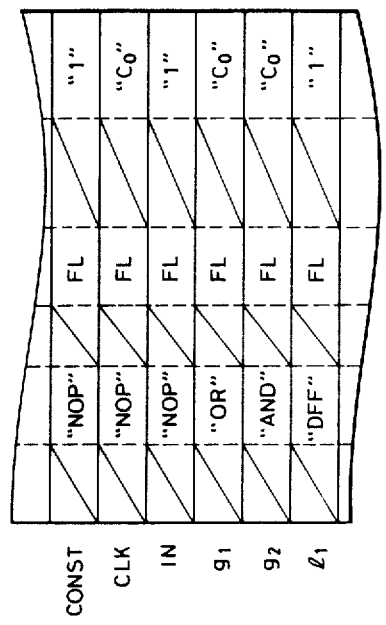
FIG. 9B shows data in the first field of the gate/latch connection table after execution of various processing for the circuit shown in FIG. 1.
Figure 9A:
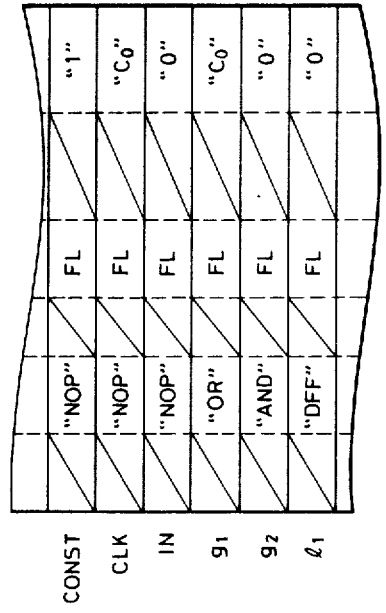
FIG. 9A shows data in the first field of the gate/latch connection table after execution of initial value setting processing for the circuit shown in FIG. 1.

FIG. 9A shows the behavior (of the first field of FIG. 8 only) at the instant when the processing of the initial setting 100 shown in FIG. 5 has been ended on the basis of the table 124 of FIG. 8 and corresponds to the instant denoted by the circled a of FIG. 4. The input terminals CLK and IN are set with the signal values '$C_0$' and '0', respectively. Moreover, the signal value '$C_0$' set in the input terminal CLK is caused to propagate to the gate $g_1$ so that the signal value of this gate $g_1$ is set at '$C_0$', but not to the gate $g_2$ (because the input terminal IN is at '0') so that the signal value of this gate $g_2$ is set at '0'. As a result, no propagation of '$C_0$' is required any more. On the other hand, the signal value of the latch $l_1$ is initially set at '0'. FIG. 9B corresponds to the instant denoted at an encircled H in FIG. 4. After the fall-down of the clock, the input terminal IN is set at the value '1' by setting the external input so that the event is caused to propagate to the gate $g_2$ by the gate simulation 105 to set the value of the gate $g_2$ at '$C_0$' and further to the latch $l_1$. In the next latch simulation 106, moreover, the input value of the clock terminal CLK (which should be referred to FIG. 1) of the latch $l_1$ is at '$C_0$', which is equal to that of the current clock CC. As a result, the input value '$C_0$') is converted, as shown in FIG. 14, into the value '1' so that the signal value of the latch $l_1$ takes the value '1'.

The detailed processing procedures of the aforementioned steps 102 to 110 will be described in the following with reference to FIG. 6:

Step 102: Rise of the clock having the phase number m; The clock signal value having the clock phase number m and the noninverted clock, as shown in FIG. 7C, is set as the current clock into the current clock table 125.

Step 103: Set of the external inputs;

The external input (e.g., the external input terminal IN of FIG. 1) has such information designated by the user as concerns what value is taken for what cycle number and what clock phase number (although the detail is omitted). As a result, the value designated on the basis of that information is set as the signal value VAL in the corresponding entry of the latch/gate connection table 124 at an instant of the corresponding cycle number and clock phase number. And, the entry address of the table 124 of the gate receptive of that value, i.e., the output element address shown in FIG. 7A is written into the second gate event table (GEVT2) 120-2. In the present embodiment, two gate event tables are prepared, the first one (GETV2) 120-2 of which writes in the output element address and the second one (GEVT1) 120-1 reads out the address transferred thereto. Two next latch event tables and two multiple clock gate event tables are also prepared to similarly conduct the writing-in and reading-out operations, as will be described hereinafter. Incidentally, the two tables can be controlled to alternately conduct the writing-in and reading-out operations.

Figure 6:
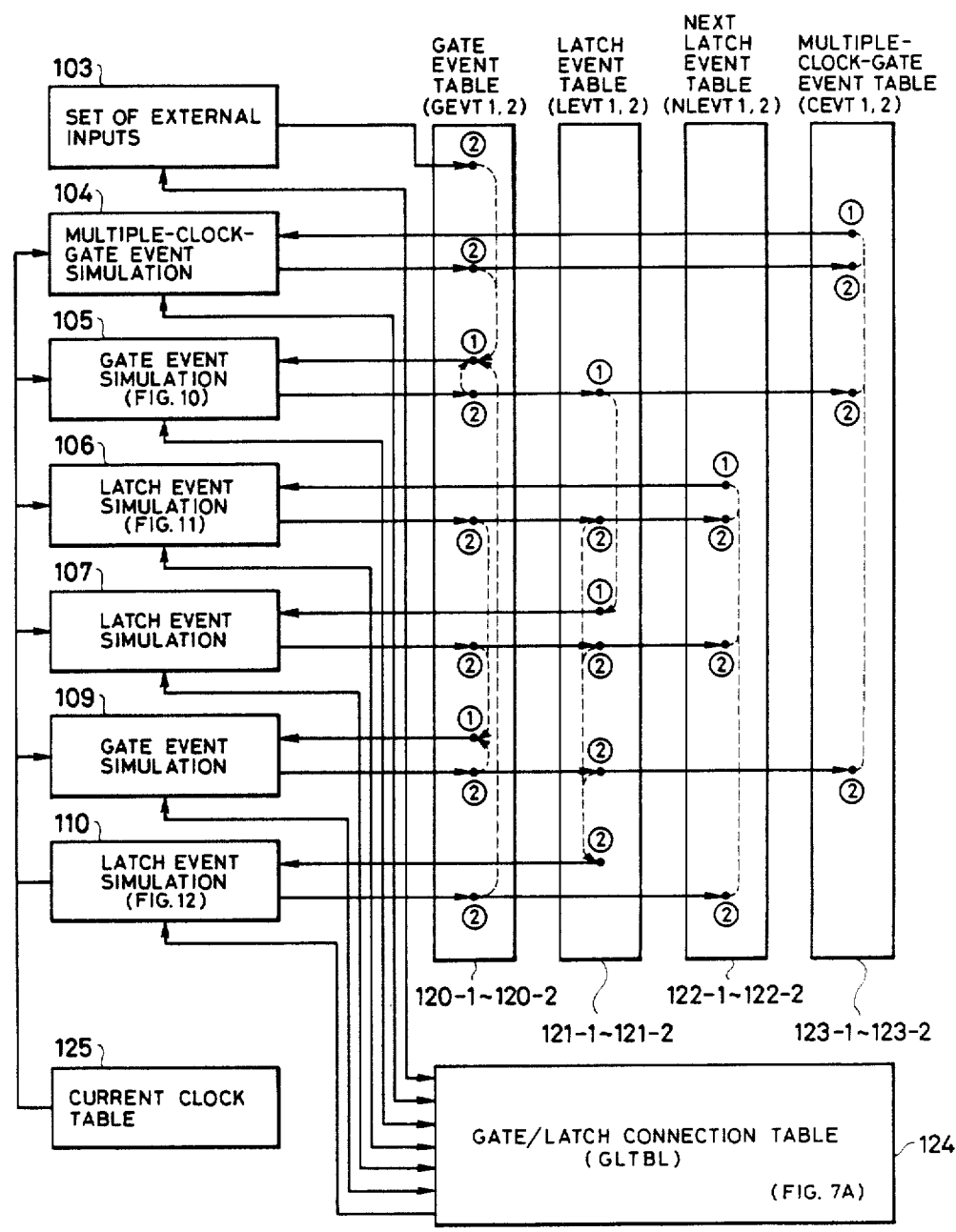
FIG. 6 shows various tables accessed various processing shown in FIG. 5.

Incidentally, in FIG. 6, the broken lines appearing in the various event tables indicate reference relationships, and encircled numerals 1 and 2 indicate which of the two tables are to be accessed.

Moreover, the event is written in the various event tables and then read out therefrom. The event to be used in this case means the address of the entry of the table 124 corresponding to the gate or latch having its input value varied.

Step 104: Multiple clock gate event simulation:

The multiple clock gate event is a gate event having two clock signal values of different clock phase numbers as the input value. As shown in FIG. 13, in case two clock signal values '$-C_p$' and '$C_m$' (wherein the letter m is identical to the phase number of the current clock CC, and m$\neq$p) of different phase numbers are inputted in the AND operation, for example, the output value takes '$C_m$', and the value '$-C_p$' disappears. As a result, the value '$-C_p$' has to be reflected on the output value, when the phase number of the current clock is switched later to p, so that the present event (i.e., the gate event having two clock signal values of different clock phase numbers as the input value) has to be reserved as the event after the evaluation. Since the multiple clock gate event has to be subjected to a special processing different from the ordinary gate event processing, as described above, there are provided multiple clock gate event tables (CEVT1/2) 123-1 and 123-2 which are oriented thereto.

The processing procedures of the multiple clock gate event simulation will be described in the following:

(1) The event of the second table (CEVT2) 123-2 is transferred to the first multiple clock gate event (CEVT1) 123-1;

(2) The event (i.e., the address of the corresponding entry of the table 124) is taken out from the CEVT1, and the corresponding entry is read out from the table 124;

(3) The logic operation of the gate is conducted;

(4) If the output value varies, a new output value is written in the corresponding entry of the table 124, and the output element address (i.e., the entry address to the table 124 corresponding to another element receptive of the output value) is written in the GEVT2;

(5) If two clock signal values of different clock phase numbers are as the input value, the present event is written again in the CEVT2;

(6) The aforementioned series processings (2) to (5) are repeated until the events of the CEVT1 become empty.

Figure 10:
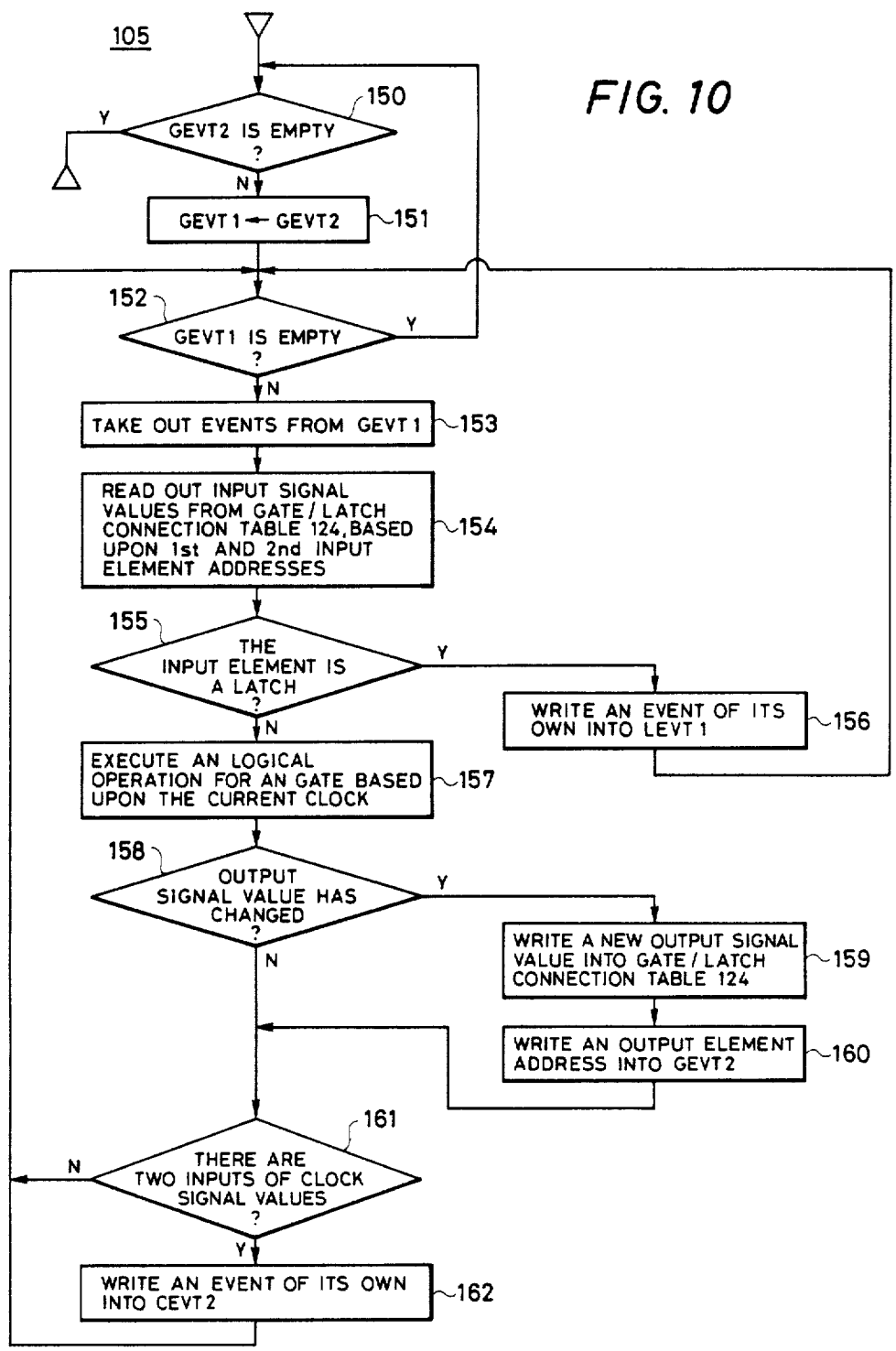
FIG. 10 is a detailed processing flowchart showing the gate event of the simulation processings shown in FIG. 5 and based on the present invention.

Step 105: Gate event simulation;

FIG. 10 shows the processing flow chart of the gate event simulation. At first, an event of the second gate event table (GEVT2) 120-2 is transferred to the first gate event table (GEVT1) 120-1. And, the event is taken out from the GEVT1, and the corresponding entry is read out from the table 124 on the basis of that event. And, the latch event and the gate event are separated (of which the latch event is also stored temporarily in the gate event table, as will be described hereinafter). The latch event, if so, has its own event written as it is in the second latch event table (LEVT2) 121-2 without any latch arithmetic processing.

For the gate event, the input value is read out from the table 124 on the basis of the first and second input element addresses so that the gate is logically operated. If the output value varies, moreover, a new value is written in the table 124, and the output element address is also written in the GEVT2. In case, on the other hand, two clock signal values of different phase numbers are present as the input value independently of the variations of the output signal value, their own events are written in the multiple clock gate table CEVT2. Incidentally, the processings of the events written in the CEVT2 are conducted later at the step 104, as explained above.

If the events of the GEVT1 become empty, the events of the GEVT2 are examined. If empty, the processings are ended. If no, the events of the GEVT2 are processed by similar procedures after they have been transferred to the GEVT1. In other words, these are repeated until new events are written to more in the GEVT2. This means that the combination circuit (i.e., the gang of the gates) between the latches is simulated by the event drive method so that all the events have propagated to reach the latches. Incidentally, at this time, the latch events are written temporarily in the GEVT2. As has been described hereinbefore, however, the latch events are discharged to the latch event table LEVT2.

Figure 11:
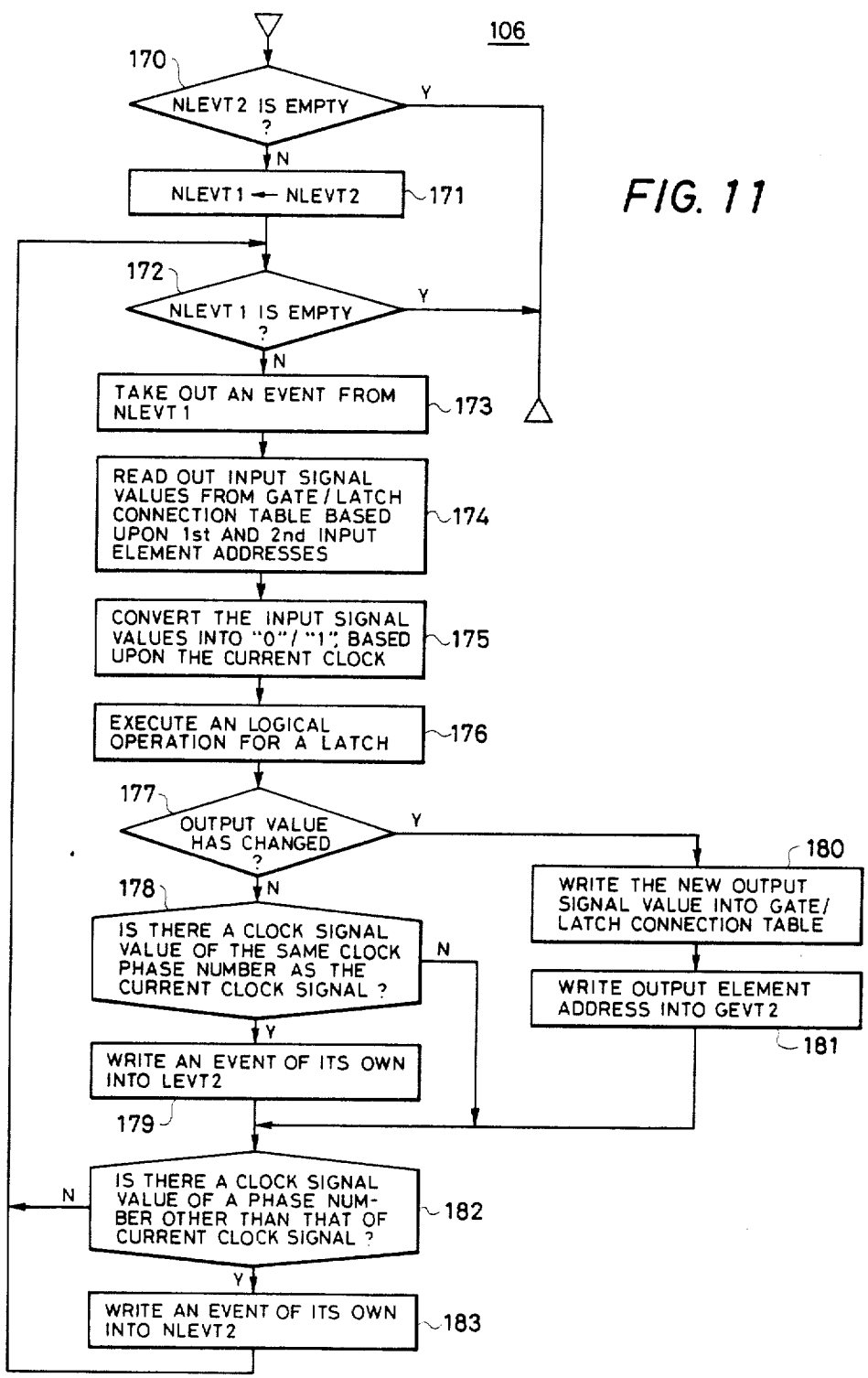
FIG. 11 is a flow chart of a latch event simulation which is executed when a clock signal rises.

Step 106: Latch event simulation:

FIG. 11 shows a processing flow chart. The present simulation processes an event which was written in the second next latch event table (NLEVT2) 122-2. This event is written in the following case. When the logic operation is to be conducted, a clock signal value is converted into the signal value '0' or '1', as shown in FIG. 14, in case it is present in the input. And, the logic operation of the latch is conducted at the converted value. In case a clock signal value different from the phase number of the current clock CC is present at the input, it is written in the NLEVT2 and is specially administered because the output signal value may possibly vary later.

At first, the event of the NLEVT2 is transferred to the first next latch event table NLEVT1 122-1. And, the event is taken out from the NLEVT1, and the corresponding entry is read out from the table on the basis of that event. And, an input value is read out from the table 124 on the basis of the first and second input element addresses. The input value is converted into the value '0' or '1', as shown in FIG. 14, if it is the clock signal value, and the logic operation of the latch is then conducted.

If the output value varies, its new value is written in the table 124, and the output element address is also written in the GEVT2.

Next, in case the output value does not vary and in case a clock signal value having the same phase number as the current clock CC is present at the input, its own event is written in the LEVT2. Since the output value may possibly be varied by the fall-down of the current clock CC, it is written in the LEVT2 and is evaluated again at the step 110. Next, in case a clock signal value different from the phase number of the current clock CC is present at the input independently of the variation of the output value, the event of its own is written again in the NLEVT2.

And, the aforementioned series processings are repeated to the end until the NLEVT1 becomes empty.

Step 107: Latch event simulation:

This step has a processing flow similar to that of FIG. 11 used at the step 106 except the following points. In FIG. 11, specifically, the steps 170 and 171 are unnecessary, and the NLEVT1 of the steps 172 and 173 are replaced by the LEVT1.

Step 108: Fall-down of the clock having the phase number m:

A clock signal value for the inverted clock $-C_m$ is set into the current clock table 125.

Step 109: Gate event simulation:

This step has a processing flow similar to that of FIG. 10 used at the step 105 except the following point. Specifically, the LEVT1 of the step 156 of FIG. 10 is replaced by the LEVT2.

Figure 12:
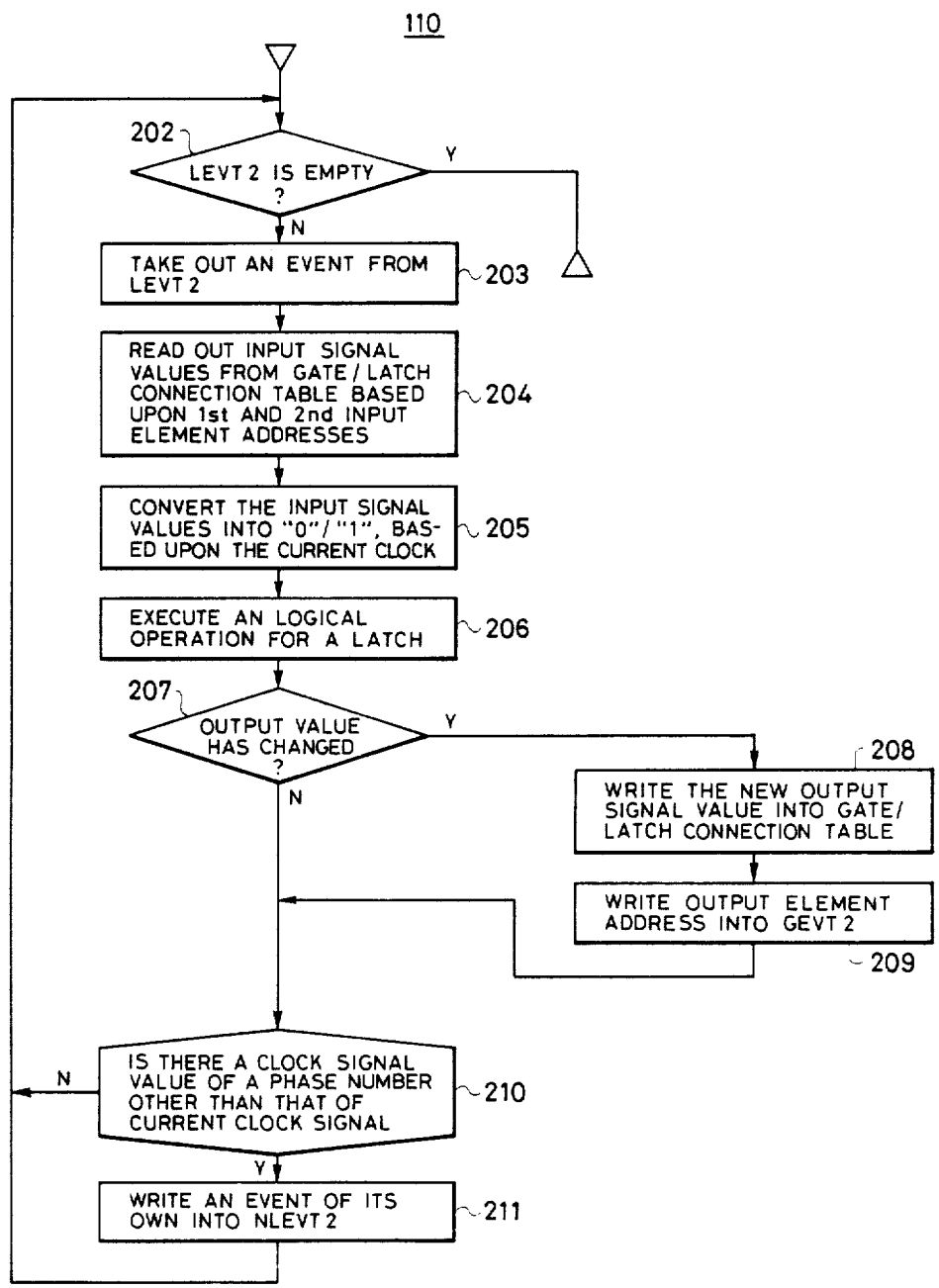
FIG. 12 is a flow chart of a latch event simulation which is executed when a clock signal falls.

Step 110: Latch event simulation:

The processing flow is shown in FIG. 12 and is basically similar to that of FIG. 11 except the following points. In FIG. 12, specifically, no transfer occurs between the event tables so that the event is taken out directly from the LEVT2. Moreover, the processings of the steps 178 and 179 of FIG. 11 are dispensable because the rise and fall of the phase number m of the current clock CC have been ended.

The steps having longer processing time periods are at 104 to 107, 109 and 110, whose processings are speeded up by the vector processing. How the representative processing or the gate event simulation (FIG. 10) is collectively speeded up by the vector processing will be described in the following with reference to FIGS. 17A and 17B.

Figure 17A:
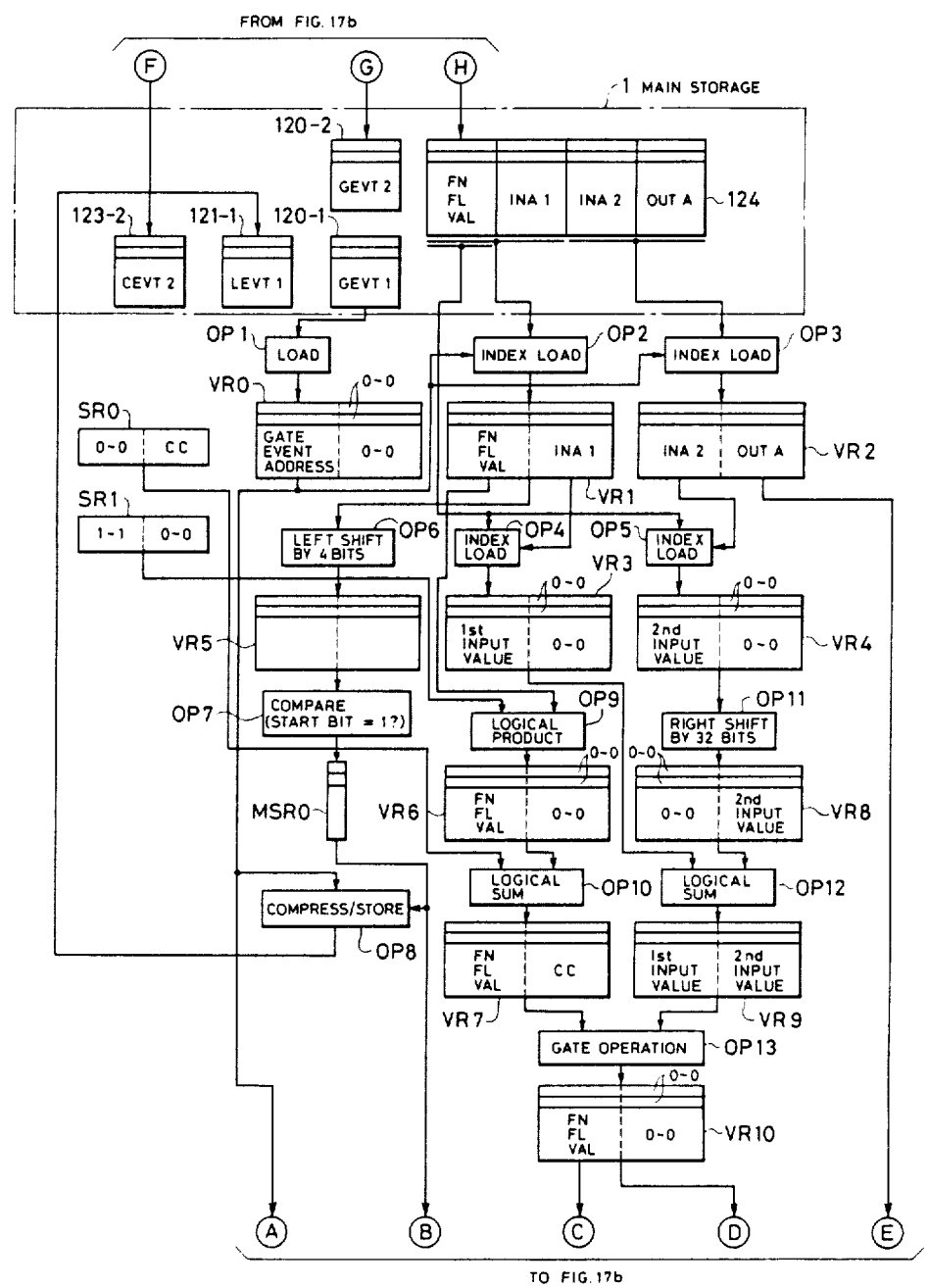
FIGS. 17A and 17B are combined to provide flowcharts which are expanded from the detailed processing flows are expanded into vector instructions, based on the construction of FIG. 15.
Figure 17B:
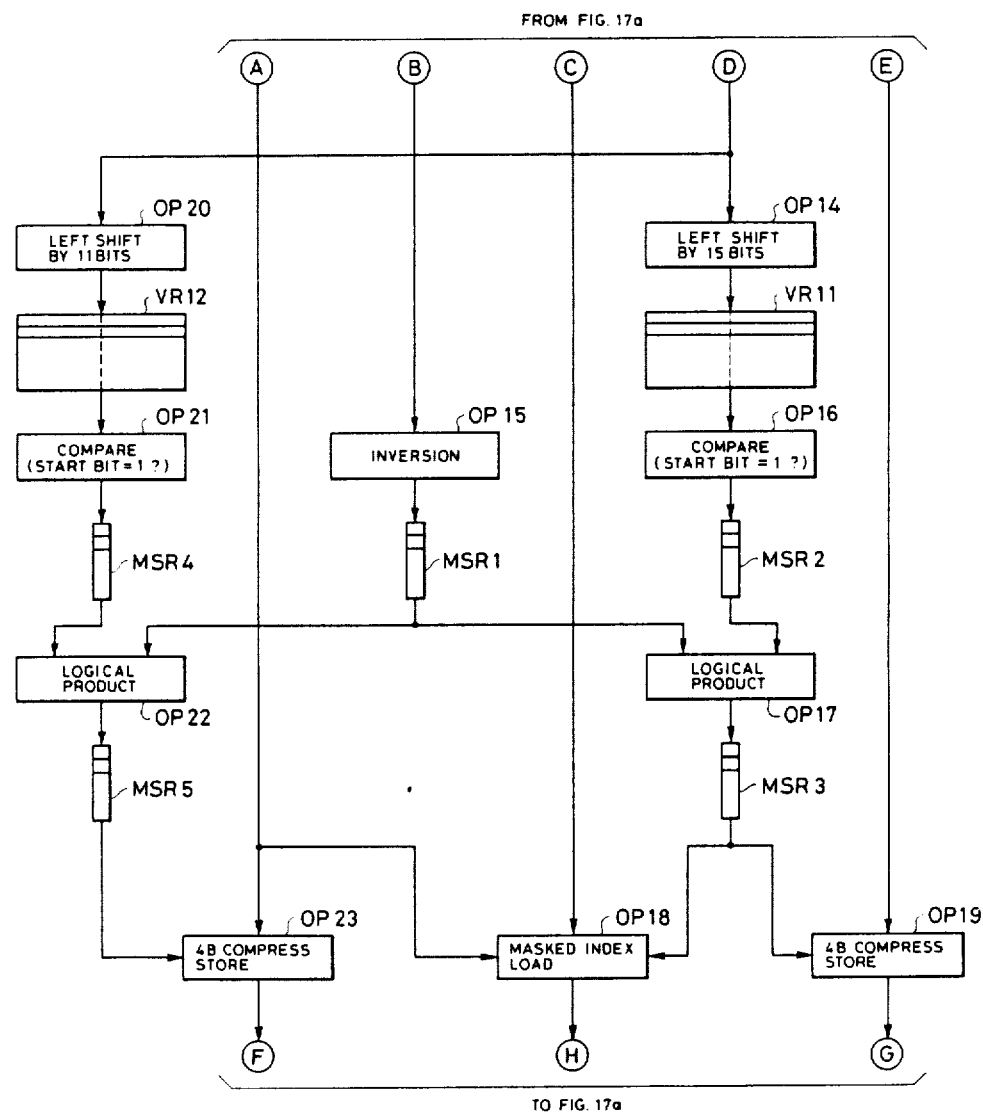

FIGS. 17A and 17B show the case in which the processing of the gate event simulation of the foregoing step 105 is expanded into vector instructions with the hardware structure of FIG. 15 on the basis of the processing flow of FIG. 10. Incidentally, the portions expanded into the vector instructions are the processing steps 152 to 162 of FIG. 10. In FIGS. 17A and 17B: reference characters OP1 to OP23 denote vector processings corresponding to vector instructions, respectively; characters VR0 to VR12 0th to 12th vector registers; letters SR0 and SR1 0th and 1st scalar registers; and letters MSR0 to MSR5 0th to 5th mask registers.

The summary of the processing of the step 105 is as follows:

At first, the gate event tables GEVT1/2, the latch event table LEVT1, the multiple clock gate event table CEVT2, and the gate/latch connection table are stored in the main storage 1. These processings are executed at the processing step 21 of FIG. 16. Next, the address informations for accessing the various tables stored in the main storage 1 are set into the address registers 9-1. Incidentally, these processings are executed at the processing step 22 of FIG. 16. Subsequently, it is checked whether or not the GEVT2 is empty. If YES, the processings are ended, and the subsequent processing is executed. If NO, the content of GEVT2 is transferred to the GEVT1. Incidentally, these processings are executed at the processing steps 23 and 24. And, when the content is completely transferred to the GEVT1, an EXVP instruction is issued to designate vector instruction series (at the processing step 26 of FIG. 16) thereby to execute the vector processing.

This vector instruction series is one for vector-processing the processing steps 152 to 162 of FIG. 10, as will be summarized in the following although the detail will be described hereinafter. Specifically, the vector registers are sequentially loaded with the events from the GEVT1 stored in the main storage 1. More specifically, the GEVT1 has therein the address (i.e., the entry address stored with the information of the corresponding gate of the gate/latch connection table (which should be referred to FIG. 7)), which is stored with the information of the gate or latch to be evaluated. The vector registers are loaded with that address, on which the gate/latch connection table placed in the main storage 1 is accessed to load the vector registers sequentially with the function code FN, the flag FL, the signal value VAL, the first/second input element addresses INA1 and INA2, and the output element address OUTA. Here, the input element address is assumed to designate the address concerning what entry of the gate/ latch connection table has the gate or latch providing the input of its own gate or latch. On the other hand, the output element address is assumed to designate the address concerning what entry of the gate/latch connection table has the gate or latch providing its own gate or latch.

Next, on the basis of the first/second input element addresses loaded into the vector register, the gate/address connection table is accessed to load the vector registers with the signal value, i.e., the input signal value of the gate or latch. And, the event (which means the address loaded into the vector registers from the GEVT1) of its own loaded into the vector registers, the function code, the flag, the signal value, the input signal value, the output element address, and the current clock set in the scalar registers are used to conduct the processing steps 155 to 162 of FIG. 10, as will be detailed hereinafter. Incidentally, the logic operation of the processing step 157 is assumed to be executed at a high speed by the simulation-oriented arithmetic and logic unit shown in FIG. 18.

The processing of the step 105 will be described in more detail in the following. Incidentally, it is assumed that the executions of the vector instruction series corresponding to the vector processings OP1 to OP2 is started in response to the EXVP instructions after the scalar processing device 2 has finished the settings of scalar data into the scalar registers SR0 and SR1 and address information into the address registers 9-1 at the processing steps 21 to 24 (FIG. 16) of the preliminary processings for the vector processings. It is also assumed that the number of elements of the vector data to be processed, i.e., the number of events written in the GEVT1 (i.e., the number of gates or latches to be evaluated) has been calcualted in advance and designated by the aforementioned EXVP instruction. As a result, the vector processings are ended by the designated number.

At first, by the vector processing OP1, the VR0 is loaded sequentially by the number designated by the main storage 1 with the addresses (i.e., the entry addresses of the table 124 corresponding to the gate event of its own) of the gate event from the gate event table 120-1. By the vector processings OP2 and OP3, the VR1 and VR2 are loaded, by indexing those addresses, with the corresponding function, flag, signal value, first and second input element addresses and output element addresses from the table 124.

Next, by the vector processings OP4 and OP5, the VR3 and VR4 are loaded with the first and second input values, respectively, from the table 124 by indexing the first and second input element addresses.

By the vector processing OP6, moreover, the content of the VR1 is shifted leftward (namely, the bit having an F number indicating the latch operation appears at the most lefthand end, as shown in FIG. 7) and written in the VR5. By the vector processing OP7, the most lefthand (or start) bit of the data of the VR5 is examined. If the bit is at '1', mask information for setting the corresponding element of the MSR at '1'. If the bit is at '0', mask information for setting the same at '0'. By the vector processing OP8, still moreover, the gate event address of the VR0 is compressed and stored in the latch event table 121-1 on the basis of the mask information of that MSR0. Incidentally, the compressed storage is defined to regularly compress and store only the gate event address of the VSR0 corresponding to the element having the value '1' in the main storage 1. As a result, by the vector processing OP8, only the latch event (which is temporarily stored in the gate event table, as has been described above) can be stored in the latch event table 121-1.

Subsequently, by the vector processings OP9 and OP10, the VR7 finally has its left 4B set with the function code FN, the flag FL and the signal value VAL and its right 4B set with the current clock CC of the SR0. By the vector processings OP11 and OP12, the VR9 finally has its left 4B set with the first input value and its right 4B set with the second input value. And, by the vector processing OP13, the gate processing is conducted by using the date of the aforementioned set VR7 and VR9, and the result is set into the VR10.

Incidentally, these gate operations are executed by the simulation-oriented arithmetic and logic unit 11-2 featuring the present invention.

Next, by using the vector processings OP14 to OP17, the MSR3 is finally set with the mask information, in which the mask having a varying output value and corresponding to the element or the gate event (i.e., the gate or the true gate event operated) is caused to take the value '1' whereas another mask is caused to take the value '0'. And, by the vector processing OP18, on the basis of the mask information of that MSR3, the table 124 is stored with the function, flag and signal value (i.e., a new value having varied) which have been set into the left 4B of the VR10 by indexing the gate event address of the VR0. Incidentally, the storage of the elements having their mask values corresponding to the value '0' is suppressed. Next, by the vector processing OP19, on the basis of the mask information of the MSR2, the output element address of the right 4B of the VR2 is compressed and stored in the gate event table 120-2.

Subsequently, by the vector processings OP20 to OP23, only the gate event address of the VR0 of the elements corresponding to the case, in which the input has two clock signal values, and the case of the gate event (i.e., the turn gate event having been subjected to a gate operation) is compressed and stored into the multiple clock gate event table 123-2. Thus, the processings of the vector instruction series corresponding to the vector processings OP1 to OP23 are ended.

The logic operations in the simulation-oriented arithmetic and logic unit 11-2 will be described in the following.

The data are sequentially read out from the two vector registers VR on the basis of the pipe-line control and are set into the input registers 300 and 301. In the register 300: reference letters FN designate the function code shown in FIG. 7E; letters FL the flag shown in FIG. 7D; letters VAL the signal value shown in FIG. 7C; and letters CC the current clock expressed in the same form as that of the clock signal value shown in FIG. 7C. And, it is assumed that the both the first and second input values of the register 301 are expressed in the same form as that of the signal value shown in FIG. 7C. These first and second input values, the current clock CC and the first to third bits $FN_{1\ to\ 3}$ of the function code FN are inputted to the gate operation circuit 302 and are subjected to the operations designated by the $FN_{1\ to\ 3}$. The result (i.e., the output value of the gate) is outputted in the same form as that of the signal value shown in FIG. 7C to the register 310. A fundamental operation is exemplified in FIG. 13.

The first and second input values and the current clock CC are inputted to the signal conversion circuits 303 and 304, respectively, and the input value having the clock signal value is converted into the signal value '0' or '1', as shown in FIG. 14, until it is outputted to the latch operation circuit 305. The latch operation circuit 311 receives the outputs of the conversion circuits 303 and 304 and the $FN_{1\ to\ 3}$ to subject them to the operation designated by the $FN_{1\ to\ 3}$. The result (i.e., the output value of the gate) is outputted in the same form as the signal value shown in FIG. 7C to the register 311.

The flag generator 306 is s circuit for generating the 0th to 2nd bits FN0 to 2 of the flag FN and is made receptive of the first and second input values and the current clock CC to determined the values, as shown in FIG. 7D and to output the result to the register 312.

Moreover, the FN0 to 3, the $FL_3$ and the $VAL_{0\ to\ 7}$ are set into the registers 307 to 309, respectively. The description thus far made is directed to the processings of stage 1, and the processings of stage 2 will be described in the following. By using as a selection signal the value of the start bit (i.e., the latch operation for the value '1' and the gate operation for the value '0') of the register 307, either the output value of the gate set in the register 310 or the output value of the latch set in the register 311 is selected by the selector 313 and is inputted to the comparator 314. This comparator 314 has its another input made receptive of the signal value (i.e., the output value) before the operation set in the register 309. The comparator 314 compares the two values to output the value '1' to the AND gate 315 if the comparison reveals an inconsistency. The AND gate 315 has its another input made receptive of the value (which designates propriety of the renewal of the signal value, e.g., OK for the value '1' but NO for the value '0') of the register 308. If the two values are at '1', the value '1' is outputted to the AND gate 315 to set the VAL of the register 317 with the operated new signal value which is outputted through the selector 316 from the selector 313. If the two values are not at '1', the signal value before the operation set in the register 309 is set into the VAL of the register 317. At the same time, the values of the registers 307, 308 and 312 are set as they are into the FN, FL, $FL_3$ and $FL_{0\ to\ 2}$ of the register 317, and the output of the AND gate 315 is set into the $FL_4$ of the FL. Incidentally, the purpose of the flag $FL_3$ is for a processing (e.g., the logic inspection simulation) to set a predetermined element of a logic circuit at a predetermined value independently of an input value. The embodiment of the present arithmetic and logic unit has been described in the case of two divided stages but should not be limited thereto. Generally speaking, the division is desirably made into a number of stages so that each stage can be processed in a pipe-line. Incidentally, the present embodiment is exemplified by the simulation-oriented arithmetic and logic unit, but a similar arithmetic function can also be incorporated into the existing arithmetic and logic unit for common use.

As has been described hereinbefore, according to the present invention, the logic simulating processing based on the clock-synchronized and zero delay time event driving method is enabled to efficiently speed up the logic simulation by suppressing as much as possible the generation of such an ineffective one of the events occurring in accordance with the rise/fall of the clock signal as will exert no influence upon the actual logic operations and by newly providing the simulation-oriented vector instruction for especially conducting the processing portion specific to the logic simulation to process it among the existing vector instruction series. As a result, it is possible to realize a far higher simulation speed than that of the existing software logic simulator utilizing the general purpose processor (or the scalar processor).

What is claimed is:

1. A logic simulation method for computing, by means of a computer, the variation of the output of at least one latch of a clock-synchronized logic circuit which includes a combination logic circuit having a plurality of logic gates and which is connected to receive at least one input signal and a plurality of clock signals of different phases, said latch being responsive to the output of said combination logic circuit in response to the rise or fall of said clock signals for latching said combination circuit output, comprising the steps of:

(a) determining whether the outputs of said logic gates have the value 0 to 1 and determining a function of the signal values of one of said clock signals, on the basis of the initial value of said input signal, the logic function of each of said logic gates, and connection information between each of said logic gates and another logic gate or clock signal source;

(b) calculating the output of each of said logic gates at each of a plurality of sampling instants for each of a plurality of machine cycles which coincide with the rise or fall of a first phase clock signal, including judging whether or not said input signal has varied during a time period between sampling instants, and calculating said outputs only when said input signal has varied for such one of said logic gates as is possibly susceptible to the influences of the variation of said input signal;

(c) calculating the output of said latch at each of said sampling points from both the value of such outputs calculated at said step (b) as have been inputted to the latch and a predetermined function to be executed by said latch at each of said sampling points, including calculating, when said output value is a function of the value of one of said clock signals, the output of said latch on the basis of the signal value, which relates to said one clock signal at each of said sampling points, and said function of the latch; and (d) repeating said steps (b) and (c) in response each of the clock signals of different phases.

2. A logic simulation method according to claim 1, wherein said step (b) further include the sub-steps of;

(e) calculating the output of a first one of said logic gates, to which said input signal is fed, and comparing said output with the output calculated at a preceding sampling instant;

(f) calculating the output of a second one of said logic gates, to which the output of said first logic gate is fed as an input, and comparing said output with the output of said second logic gate, which has been detected at a previous sampling instant;

(g) conducting a comparison of the output of a third one of said logic gates, to which the output of said second logic gate is fed as an input, when an inconsistency is detected as a result of the comparison at said step (f);

(h) sequentially executing similar processings for succeeding ones of said logic gates each time an inconsistency is detected as a result of the comparison of said step (g); and (i) interrupting the executions of said steps (f), (g) and (h), respectively, when the inconsistencies are detected at the respective comparisons of said steps (e), (f) and (g).

* * * * *